(12) United States Patent
Bae

(10) Patent No.: US 6,759,682 B2
(45) Date of Patent: Jul. 6, 2004

(54) ELECTRO-LUMINESCENCE PANEL

(75) Inventor: Sung Joon Bae, Seongnam-shi (KR)

(73) Assignee: LG.Philips LCD Co., Ltd., Seoul (KR)

(*) Notice: Subject to any disclaimer, the term of this patent is extended or adjusted under 35 U.S.C. 154(b) by 0 days.

(21) Appl. No.: 10/282,033

(22) Filed: Oct. 29, 2002

(65) Prior Publication Data

US 2003/0085664 A1 May 8, 2003

(30) Foreign Application Priority Data

Nov. 3, 2001 (KR) .................................... P2001-68395

(51) Int. Cl.[7] ........................ H01L 29/15; H01L 29/04; H01L 31/036
(52) U.S. Cl. .............................. 257/72; 257/82; 257/83
(58) Field of Search .................. 257/72–100, 296–315

(56) References Cited

U.S. PATENT DOCUMENTS 5,940,055 A * 8/1999 Lee

* cited by examiner

Primary Examiner—Fetsum Abraham
(74) Attorney, Agent, or Firm—McKenna Long & Aldridge LLP

(57) ABSTRACT

An electro-luminescence panel that is adaptive for maximizing a capacitance of a storage capacitor. A plurality of electro-luminescence cells are arranged at crossings between gate lines and data lines in the panel. An electro-luminescence cell driving circuit drives the electro-luminescence cells. In the driving circuit, a power supply supplies power to the electro-luminescence cells. A first thin film transistor is connected between the power supply and the electro-luminescence cell. A second thin film transistor is connected between the data line and a gate electrode of the first thin film transistor to serve a switch of the electro-luminescence cell. A storage capacitor is connected between the gate electrode of the first thin film transistor and a pre-stage gate line. Accordingly, a capacitance value of the storage capacitor is maximized with the aid of the pre-stage gate line upon formation of the storage capacitor, thereby preventing flicker caused by a kickback phenomenon.

19 Claims, 6 Drawing Sheets

ELECTRO-LUMINESCENCE PANEL

This application claims the benefit of Korean Patent Application No. 2001-68395, filed on Nov. 3, 2001, which is hereby incorporated by reference for all purposes as if fully set forth herein.

BACKGROUND OF THE INVENTION

1. Field of the Invention

This invention relates to an electro-luminescence display (ELD), and more particularly to an electro-luminescence panel that is adaptive for maximizing a capacitance of a storage capacitor.

2. Discussion of the Related Art

Recently, various flat panel display devices have been developed reduced in weight and bulk that are capable of eliminating the disadvantages of a cathode ray tube (CRT). Such flat panel display devices include a liquid crystal displays (LCDs), field emission displays (FEDs), plasma display panels (PDPs), and electro-luminescence (EL) panels, etc.

Studies have been done for increasing a display quality of the flat panel display device and for providing the flat panel display with a large-scale screen. The EL panel in such display devices is a self-emission device. The EL panel excites a fluorescent material using carriers such as electrons and holes, etc. to display a video image. The EL panel has advantages in that a low direct current voltage driving is possible and a response speed is fast.

As shown in FIG. 1, such an EL panel includes gate lines GL1 to GLm and data lines DL1 to DLn arranged on a glass substrate 10 in such a manner to cross each other, and pixel elements PE arranged at crossings between the gate lines GL1 to GLm and the data lines DL1 to DLn. Each of the pixel elements PE is driven when gate signals on the gate lines GL1 to GLm are enabled, thereby generating light corresponding to the magnitude of a pixel signal on the data line DL.

In order to drive such an EL panel, a gate driver 12 is connected to the gate lines GL1 to GLm while a data driver 14 is connected to the data lines DL1 to DLn. The gate driver 12 sequentially drives the gate lines GL1 to GLm. The data driver 14 applies pixel signals, via the data lines DL1 to DLn, to the pixel elements PE.

As shown in FIG. 2, each of the pixel elements PE driven with the gate driver 12 and the data driver 14 consists of an EL cell OELD connected to a ground voltage line GND, and a cell driving circuit 16 for driving the EL cell OLED.

FIG. 2 is a detailed circuit diagram of the pixel element PE shown in FIG. 1, which includes a driving circuit arranged at a crossing between the gate line GL and the data line DL that is comprised of two TFTs T1 and T2.

Referring to FIG. 2, the pixel element PE includes an EL cell OLED connected to a ground voltage source GND, and an EL cell driving circuit 16 connected between the EL cell OLED and the data line DL.

The EL cell driving circuit 16 includes the second NMOS TFT T2 connected between the EL cell OLED and the supply voltage line VDD to serve a driver, a first NMOS TFT T1 connected between the data line DL and the gate electrode of the second NMOS TFT T2 to serve a switch of the EL cell OLED, and a storage capacitor Cst connected between the drain electrodes of the first NMOS TFT T1 and the supply voltage line VDD.

In this case, when a gate voltage is changed from a turn-on voltage Von into a turn-off voltage Voff upon formation of the storage capacitor Cst regarding the supply voltage line VDD as an opposite electrode, a capacitance value (Q=CV) is reduced to thereby cause a kickback phenomenon in which a data voltage having a level slightly lower than a normal level is applied. Also, because it is required to have ground voltage source GND and additional lines for increasing the capacitance, an aperture ratio and the stability of the process are reduced.

FIG. 3 is a detailed circuit diagram of another example of the pixel element PE shown in FIG. 1, which includes a driving circuit arranged at a crossing between the gate line GL and the data line DL that is comprised of two TFTs T1 and T2.

Referring to FIG. 3, the pixel element PE includes an EL cell OLED connected to a ground voltage source GND, and an EL cell driving circuit 26 connected between the EL cell OLED and the data line DL.

The EL cell driving circuit 26 includes the second NMOS TFT T2 connected between the EL cell OLED and the supply voltage line VDD to serve a driver, the first NMOS TFT T1 connected between the data line DL and the gate electrode of the second NMOS TFT T2 to serve a switch of the EL cell OLED, and a storage capacitor Cst connected between the drain electrodes of the first NMOS TFT T1 and the ground voltage line GND or a common voltage line.

In this case, since such an inclusion of the common voltage line for compensating for a kickback effect in the storage capacitor Cst requires a separate line, a problem arises in that an aperture ratio is reduced and a stability of a process for providing the voltage line is deteriorated.

SUMMARY OF THE INVENTION

Accordingly, the present invention is directed to an electro-luminescence panel that substantially obviates one or more of the problems due to limitations and disadvantages of the related art.

It is an advantage of the present invention to provide an electro-luminescence panel wherein a capacitance value of a storage capacitor is maximized with the aid of the pre-stage gate line upon formation of the storage capacitor, thereby reducing a kickback effect.

Additional features and advantages of the invention will be set forth in the description which follows, and in part will be apparent from the description, or may be learned by practice of the invention. The objectives and other advantages of the invention will be realized and attained by the method particularly pointed out in the written description and claims hereof as well as the appended drawings.

To achieve these and other advantages and in accordance with the purpose of the present invention, VCS embodied and broadly described, an electro-luminescence panel according to an embodiment of the present invention includes a plurality of gate lines; a plurality of data lines crossing the gate lines; a plurality of electro-luminescence cells arranged at crossings between the gate lines and the data lines; and an electro-luminescence cell driving circuit for driving the electro-luminescence cells, said electro-luminescence cell driving circuit including a power supply for supplying power to the electro-luminescence cells; a first thin film transistor connected between the power supply and the electro-luminescence cell; a second thin film transistor connected between the data line and a gate electrode of the first thin film transistor to serve a switch of the electro-luminescence cell; and a first capacitor connected between the gate electrode of the first thin film transistor and a pre-stage gate line.

The electro-luminescence panel the further includes second capacitor connected between the gate electrode of the first thin film transistor and the power supply.

In the electro-luminescence panel, the first thin film transistor and the second thin film transistor are any one type of PMOS type or NMOS type.

An electro-luminescence panel according to embodiment of the present invention includes a gate lines and data lines arranged on a glass substrate to cross each other; pixel elements arranged at crossings between the gate lines and data lines; each of the pixel elements driven when gate signals on the gate lines are enabled, wherein light corresponding to the magnitude of a pixel signal on the data line is generated; a gate driver connected to the gate lines, wherein the gate driver sequentially drives the gate lines; and a data driver connected to the data lines, wherein the data driver applies pixel signals, via the data lines, to the pixel elements.

In the electro-luminescence panel, each of the pixel elements consists of an electro-luminescence cell connected to a ground voltage source and an electro-luminescence cell driving circuit for driving the electro-luminescence cell.

In the electro-luminescence panel, the electro-luminescence driving circuit includes a second PMOS TFT connected between the electro-luminescence cell and a supply voltage line to serve a driver, a first PMOS TFT connected between a data line and the gate electrode of the second PMOS TFT to serve as a switch of the electro-luminescence cell, and a storage capacitor connected between the drain electrodes of the first PMOS TFT and a pre-stage gate line.

In the electro-luminescence panel, the electro-luminescence driving circuit includes a second NMOS TFT connected between the electro-luminescence cell and a supply voltage line to serve a driver, a first NMOS TFT connected between a data line and the gate electrode of the second NMOS TFT to serve as a switch of the electro-luminescence cell, and a storage capacitor connected between the drain electrodes of the first NMOS TFT and a pre-stage gate line.

In the electro-luminescence panel, the electro-luminescence driving circuit includes a second PMOS TFT connected between the electro-luminescence cell and a supply voltage line to serve a driver, a first PMOS TFT connected between a data line and the gate electrode of the second PMOS TFT to serve as a switch of the electro-luminescence cell, a first storage capacitor connected between the drain electrodes of the first PMOS TFT and a pre-stage gate line; and a second storage capacitor connected between the drain electrode of the first PMOS TFT and the supply voltage line.

In the electro-luminescence panel, the electro-luminescence driving circuit includes a second NMOS TFT connected between the electro-luminescence cell and a supply voltage line to serve a driver, a first NMOS TFT connected between a data line and the gate electrode of the second NMOS TFT to serve as a switch of the electro-luminescence cell, a first storage capacitor connected between the drain electrodes of the first NMOS TFT and a pre-stage gate line; and a second storage capacitor connected between the drain electrode of the first NMOS TFT and the supply voltage line.

It is to be understood that both the foregoing general description and the following detailed description are exemplary and explanatory and are intended to provide further explanation of the intention as claimed.

BRIEF DESCRIPTION OF THE DRAWINGS

The accompanying drawings, which are included to provide a further understanding of the invention and are incorporated in and constituted a part of this application, illustrate embodiments of the invention and together with the description serve to explain the principle of the invention.

In the drawings.

DETAILED DESCRIPTION OF THE ILLUSTRATED EMBODIMENTS

Reference will now be made in detail to embodiments of the present invention, examples of which are shown in the accompanying drawings. Wherever possible, similar reference numbers will be used throughout the drawings to refer to the same or like parts.

Figure 4:
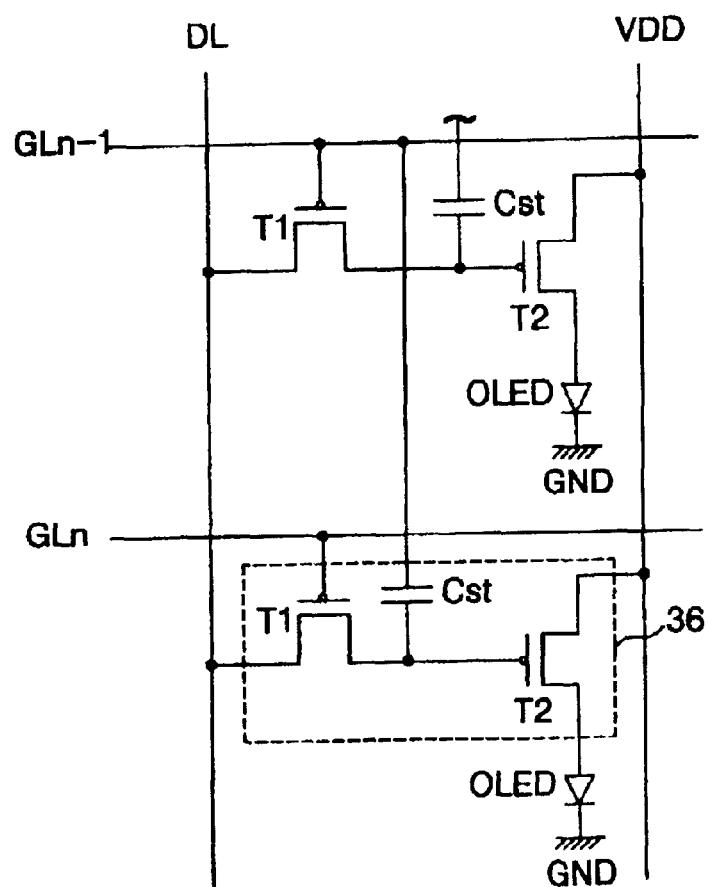
FIG. 4 is a detailed circuit diagram of a pixel element of an electro-luminescence panel according to a first embodiment of the present invention.

Referring to FIG. 4, there is shown a pixel element of an electro-luminescence (EL) panel according to a first embodiment of the present invention.

Figure 1:
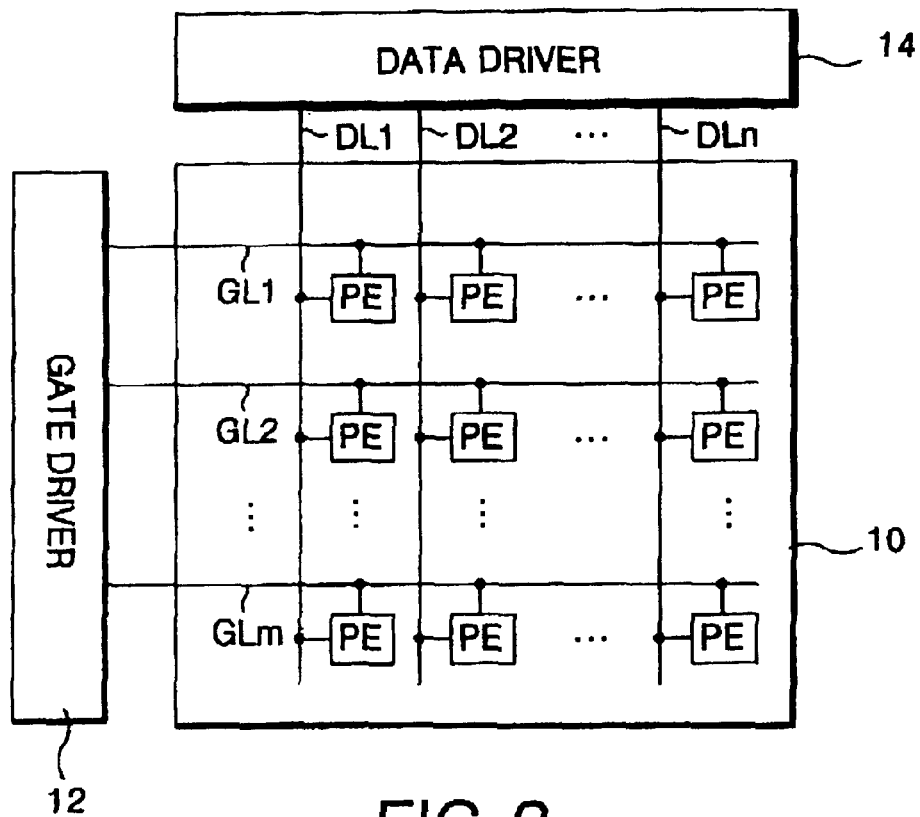
FIG. 1 is a schematic block diagram showing a configuration of a conventional electro-luminescence panel.
Figure 2:
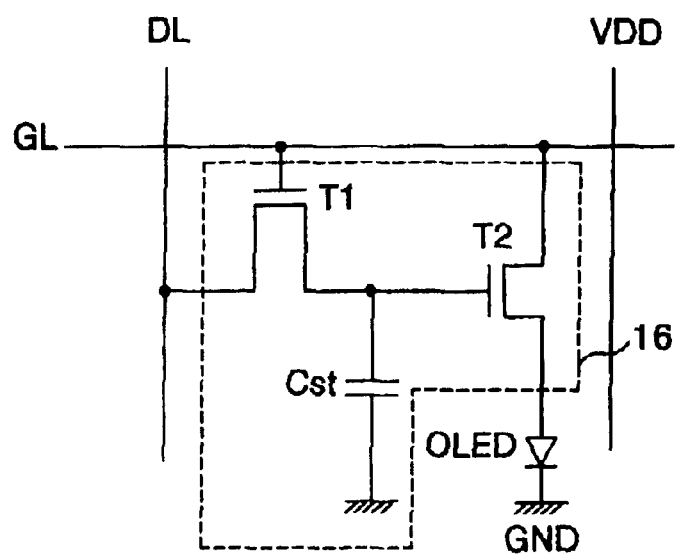
FIG. 2 is a detailed circuit diagram of the pixel element shown in FIG. 1.
Figure 3:
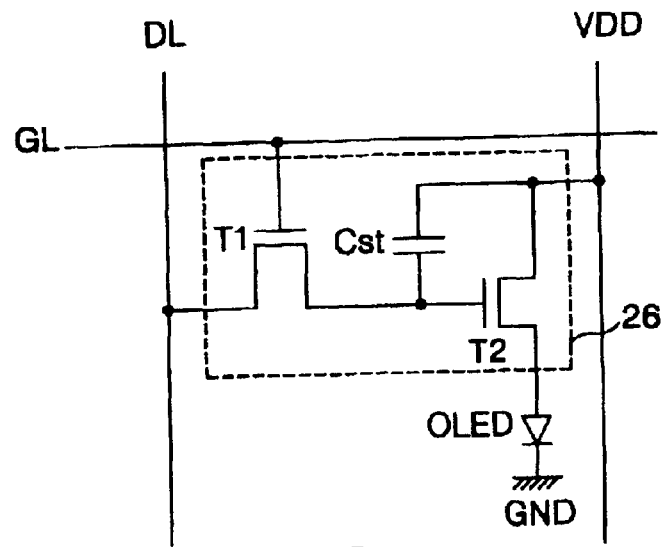
FIG. 3 is a detailed circuit diagram of another example of the pixel element shown in FIG. 1.

Like the conventional EL panel as shown in FIG. 1, the present EL panel includes gate lines GL1 to GLm and data lines DL1 to DLn arranged on a glass substrate 10 in such a manner to cross each other, and pixel elements (not shown) arranged at crossings between the gate lines GL1 to GLm and the data lines DL1 to DLn. Each of the pixel elements is driven when gate signals on the gate lines GL1 to GLm are enabled, thereby generating light corresponding to the magnitude of a pixel signal on the data line DL.

In order to drive such an EL panel, a gate driver 12 is connected to the gate lines GL1 to GLm while a data driver 14 is connected to the data lines DL1 to DLn. The gate driver 22 sequentially drives the gate lines GL1 to GLm. The data driver 14 applies pixel signals, via the data lines DL1 to DLn, to the pixel elements PE.

Each of the pixel elements PE of the EL panel consists of an EL cell OLED connected to a ground voltage source GND, and an EL cell driving circuit 36 for driving the EL cell OLED.

The EL cell driving circuit 36 includes a second PMOS TFT T2 connected between the EL cell OLED and the supply voltage line VDD to serve a driver, a first PMOS TFT T1 connected between the data line DL and the gate electrode of the second PMOS TFT T2 to serve a switch of the EL cell OLED, and a storage capacitor Cst connected between the drain electrodes of the first PMOS TFT T1 and a pre-stage gate line GLn-1.

Figure 5:
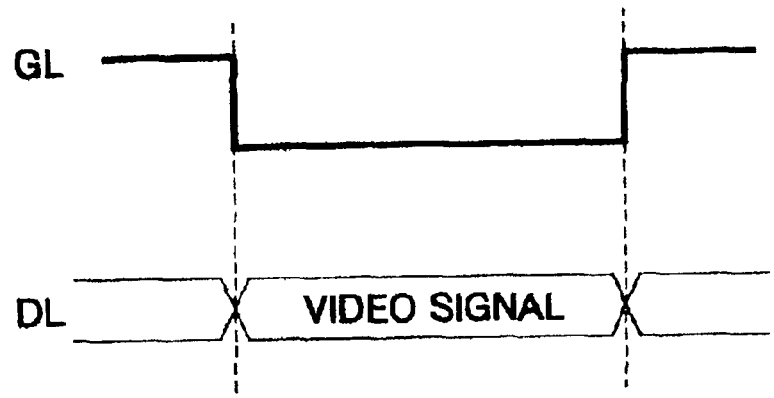
FIG. 5 is a waveform diagram of gate signals to be applied to the pixel element shown in FIG. 4.

Hereinafter, an operation of the pixel element will be described with reference to a driving waveform diagram of FIG. 5.

When a low input signal, that is, a scanning signal from the gate driver 12 is inputted to the gate line GL, the first PMOS TFT T1 is turned on. Then, a video signal with a certain amplitude inputted in synchronization with a scanning signal from the data line DL flows through the first PMOS TFT T1. This video signal is charged in the storage capacitor Cst. The storage capacitor Cst is connected to the drain electrode of the first PMOS TFT T1 and the pre-stage gate line GLn-1 to charge a video signal from the data line DL during an low voltage input period of the gate line GL.

The capacitor Cst holds the video signal applied from the data line DL and then charged during one frame interval. Owing to this holding time, the capacitor Cst maintains an application of the video signal from the data line DL to the EL cell OLED. Further, such a structure must include the number of data lines DL receiving each picture signal in correspondence with an input of each video signal such as red (R), green (G) and blue (B) signals. In this case, a high gate voltage is applied, via the pre-stage gate line, to the storage capacitor Cst, thereby maximizing a capacitance value (Q=CV).

Thereafter, the storage capacitor Cst applies a data voltage charged, via the first PMOS TFT T1, from the data line DL to the gate electrode of the second PMOS TFT T2. The second PMOS TFT T2 allows the supply voltage line VDD to be connected to an anode of the EL cell OLED with the aid of the data voltage charged in the storage capacitor Cst. As a result, the EL cell OLED is driven by a voltage difference between the supply voltage VDD and the ground voltage GND, thereby generating light corresponding to the voltage difference.

Figure 6:
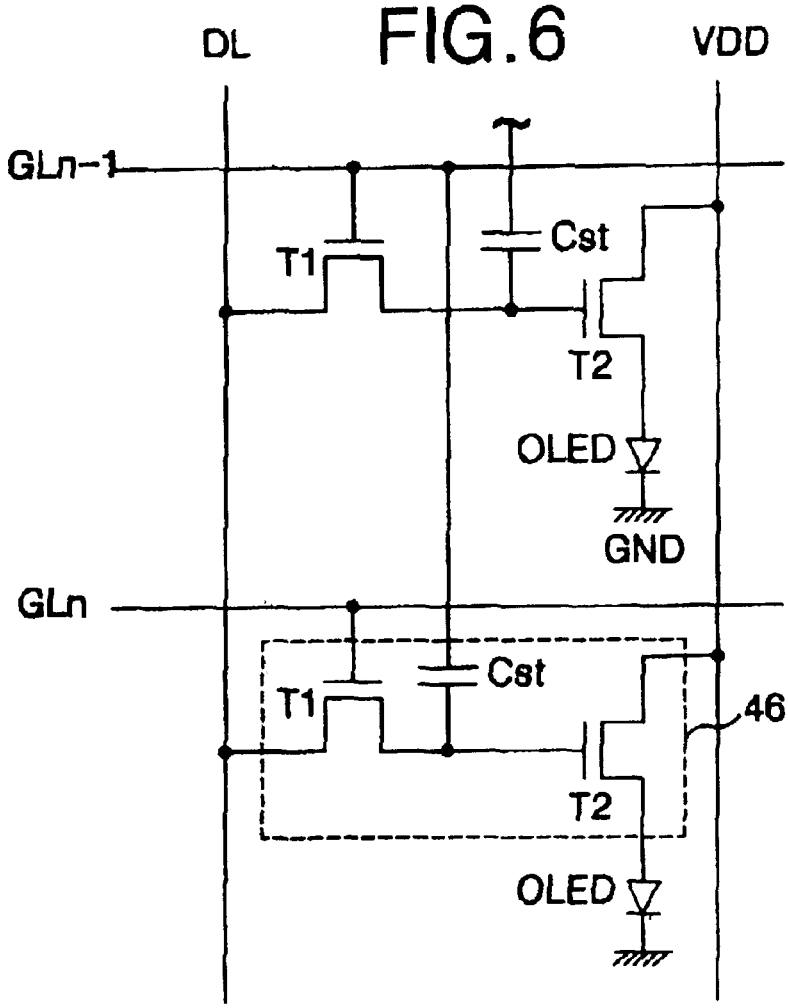
FIG. 6 is a detailed circuit diagram of a pixel element of an electro-luminescence panel according to a second embodiment of the present invention.

Referring to FIG. 6, a pixel element of an electro-luminescence (EL) panel is shown according to the second embodiment of the present invention.

Each of the pixel elements PE of the EL panel consists of an EL cell OLED connected to a ground voltage line GND, and an EL cell driving circuit 46 for driving the EL cell OLED.

The EL cell driving circuit 46 includes the second NMOS TFT T2 connected between the EL cell OLED and the supply voltage line VDD to serve a driver, the first NMOS TFT T1 connected between the data line DL and the gate electrode of the second NMOS TFT T2 to serve a switch of the EL cell OLED, and the storage capacitor Cst connected between the drain electrodes of the first NMOS TFT T1 and a pre-stage gate line GLn-1.

Figure 7:
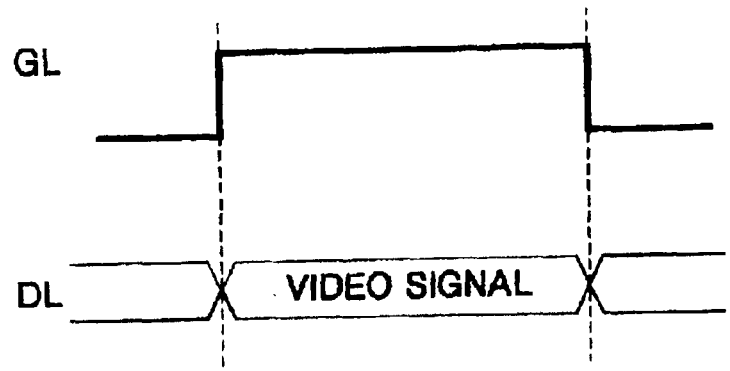
FIG. 7 is a waveform diagram of gate signals to be applied to the pixel element shown in FIG. 6.

Hereinafter, an operation of the pixel element will be described with reference to a driving waveform diagram of FIG. 7.

When a high input signal, that is, a scanning signal from the gate driver 12 is inputted to the gate line GL, the first NMOS TFT T1 is turned on. Then, a video signal with a certain amplitude inputted in synchronization with a scanning signal from the data line DL flows through the first NMOS TFT T1. This video signal is charged in the storage capacitor Cst. The storage capacitor Cst is connected to the drain electrode of the first NMOS TFT T1 and the pre-stage gate line GLn-1 to charge a video signal from the data line DL during an high voltage input period of the gate line GL.

The storage capacitor Cst holds the video signal applied from the data line DL and then charged during one frame interval. Owing to this holding time, the storage capacitor Cst keeps an application of the video signal from the data line DL to the EL cell OLED. Further, such a structure must include the number of data lines DL receiving each picture signal in correspondence with an input of each video signal such as red (R), green (G) and blue (B) signals. In this case, a high gate voltage is applied, via the pre-stage gate line, to the storage capacitor Cst, thereby maximizing a capacitance value (Q=CV).

Thereafter, the storage capacitor Cst applies a data voltage charged, via the first NMOS TFT T1, from the data line DL to the gate electrode of the second NMOS TFT T2. The second NMOS TFT T2 allows the supply voltage line VDD to be connected to an anode of the EL cell OLED with the aid of the data voltage charged in the storage capacitor Cst. As a result, the EL cell OLED is driven by a voltage difference between the supply voltage VDD and the ground voltage GND, thereby generating light corresponding to the voltage difference.

Figure 8:
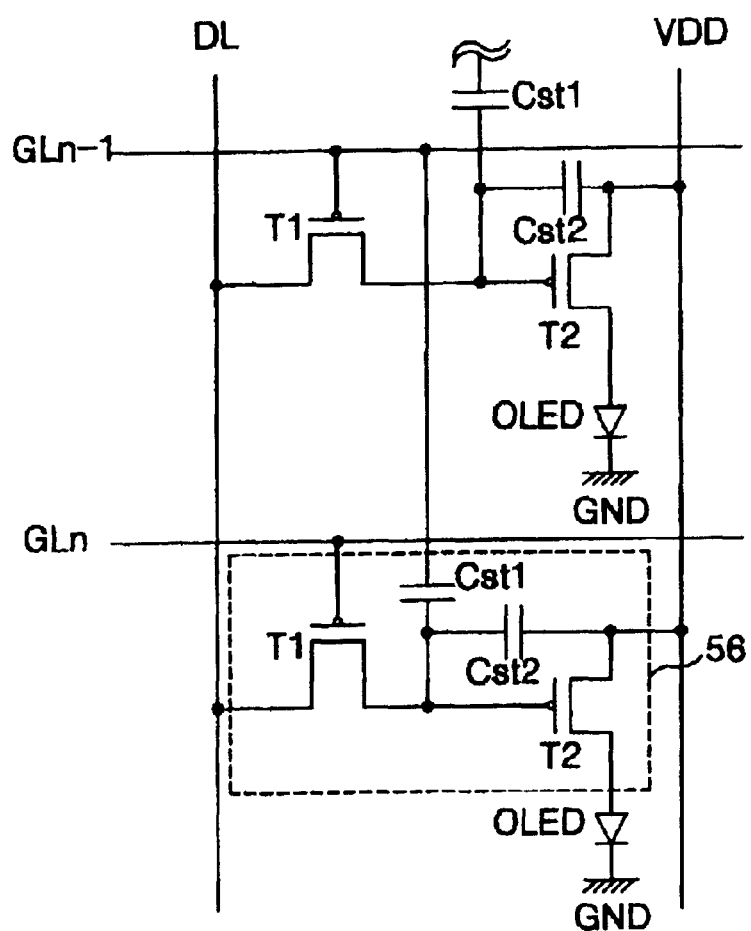
FIG. 8 is a detailed circuit diagram of a pixel element of an electro-luminescence panel according to a third embodiment of the present invention.

Referring to FIG. 8, a pixel element of an electro-luminescence (EL) panel is shown according to a third embodiment of the present invention.

Each of the pixel elements PE of the EL panel consists of an EL cell OLED connected to a ground voltage line GND, and an EL cell driving circuit 56 for driving the EL cell OLED.

The EL cell driving circuit 56 includes the second PMOS TFT T2 connected between the EL cell OLED and the supply voltage line VDD to serve a driver, the first PMOS TFT T1 connected between the data line DL and the gate electrode of the second PMOS TFT T2 to serve a switch of the EL cell OLED, the first storage capacitor Cst1 connected between the drain electrodes of the first PMOS TFT T1 and a pre-stage gate line GLn-1, and the second storage capacitor Cst2 connected between the drain electrode of the first PMOS TFT T1 and the supply voltage line VDD.

Figure 9:
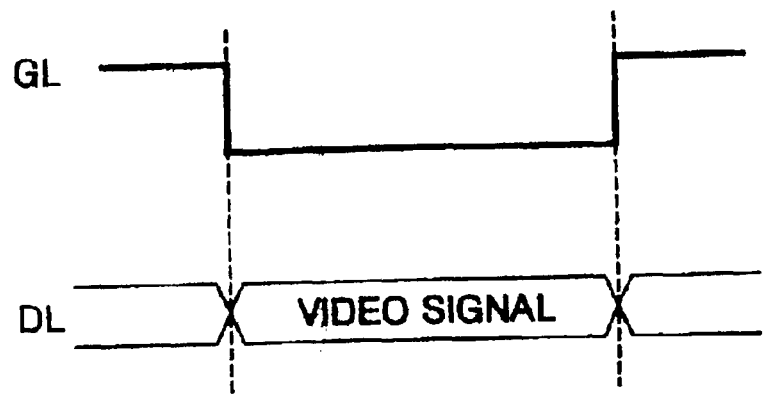
FIG. 9 is a waveform diagram of gate signals to be applied to the pixel element shown in FIG. 8.

Hereinafter, an operation of the pixel element will be described with reference to a driving waveform diagram of FIG. 9.

When a low input signal, that is, a scanning signal from the gate driver 12 is inputted to the gate line GL, the first PMOS TFT T1 is turned on. Then, a video signal with a certain amplitude inputted in synchronization with a scanning signal from the data line DL flows through the first PMOS TFT T1. This video signal is charged in the first and second storage capacitors Cst1 and Cst2. The first and second storage capacitors Cst1 and Cst2 are connected to the drain electrode of the first PMOS TFT T1 and the pre-stage gate line GLn-1 to charge a video signal from the data line DL during a low voltage input period of the gate line GL.

The first and second storage capacitors Cst1 and Cst2 hold the video signal applied from the data line DL and then charged during one frame interval. Owing this holding time, the storage capacitors Cst1 and Cst2 keep an application of the video signal from the data line DL to the EL cell OLED. Further, such a structure must include the number of data lines DL receiving each picture signal in correspondence with an input of each video signal such as red (R), green (G) and blue (B) signals. In this case, a high gate voltage is applied, via the pre-stage gate line, to the storage capacitor Cst, thereby maximizing a capacitance value (Q=CV).

Thereafter, the first and second storage capacitors Cst1 and Cst2 apply a data voltage charged, via the first PMOS TFT T1, from the data line DL to the gate electrode of the second PMOS TFT T2. The second PMOS TFT T2 allows the supply voltage line VDD to be connected to an anode of the EL cell OLED with the aid of the data voltage charged in the first and second storage capacitors Cst1 and Cst2. As a result, the EL cell OLED is driven by a voltage difference between the supply voltage VDD and the ground voltage GND, thereby generating light corresponding to the voltage the difference.

Figure 10:
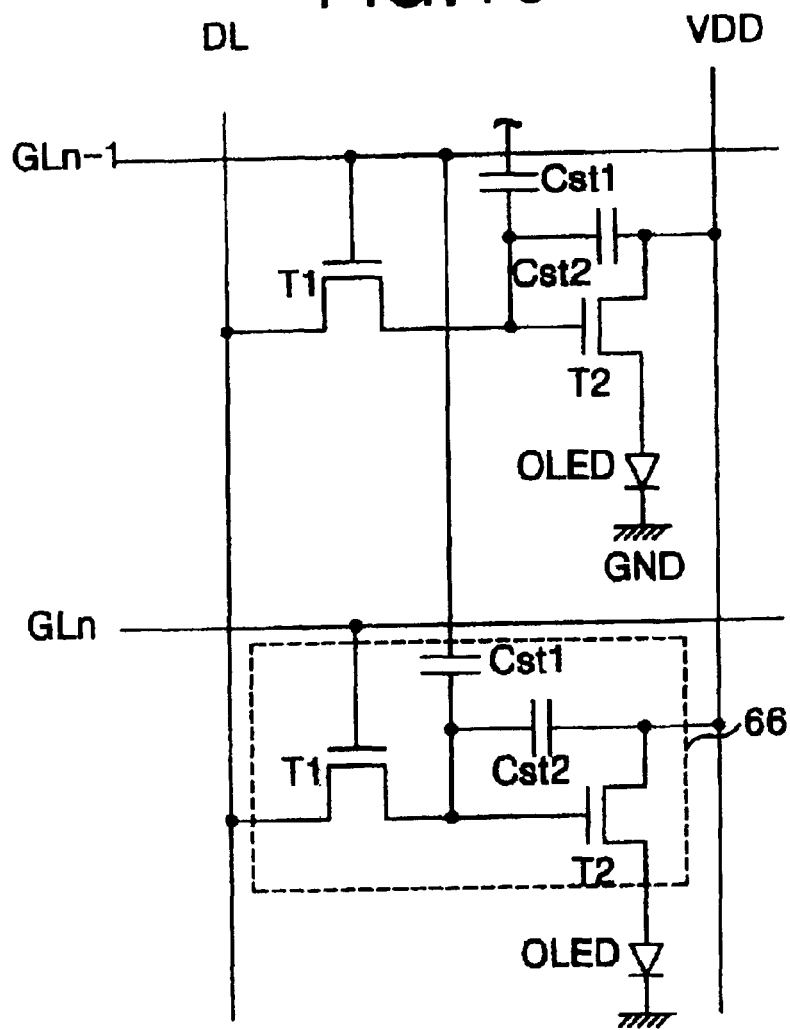
FIG. 10 is a detailed circuit diagram of a pixel element of an electro-luminescence panel according to a fourth embodiment of the present invention.

Referring to FIG. 10, a pixel element of an electro-luminescence (EL) panel is shown according to a fourth embodiment of the present invention.

Each of the pixel elements PE of the EL panel consists of an EL cell OLED connected to a ground voltage line GND, and an EL cell driving circuit 66 for driving the EL cell OLED.

The EL cell driving circuit 66 includes a second NMOS TFT T2 connected between the EL cell OLED and the supply voltage line VDD to serve a driver, a first NMOS TFT T1 connected between the data line DL and the gate electrode of the second NMOS TFT T2 to serve a switch of the EL cell OLED, a first storage capacitor Cst1 connected between the drain electrodes of the first NMOS TFT T1 and a pre-stage gate line GLn−1, and a second storage capacitor Cst2 connected between the drain electrode of the first NMOS TFT T1 and the supply voltage line VDD.

Figure 11:
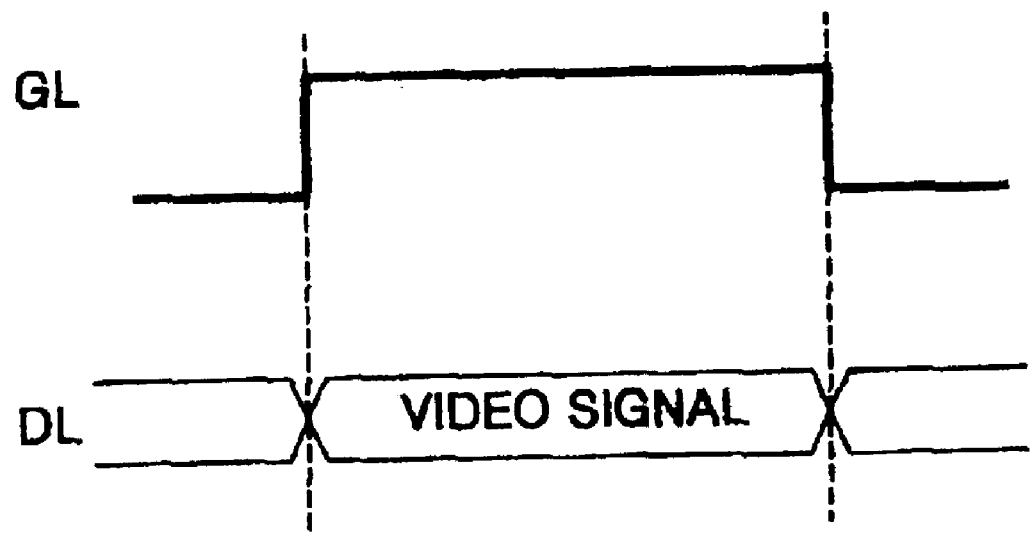
FIG. 11 is a waveform diagram of gate signals to be applied to the pixel element shown in FIG. 10.

Hereinafter, an operation of the pixel element will be described with reference to a driving waveform diagram of FIG. 11.

When a high input signal, that is, a scanning signal from the gate driver 12 is inputted to the gate line GL, the first NMOS TFT T1 is turned on. Then, a video signal with a certain amplitude inputted in synchronization with a scanning signal from the data line DL flows through the first NMOS TFT T1. This video signal is charged in the first and second storage capacitors Cst1 and Cst2. The first and second storage capacitors Cst1 and Cst2 are connected to the drain electrode of the first NMOS TFT T1 and the pre-stage gate line GLn−1 to charge a video signal from the data line DL during a low voltage input period of the gate line GL.

The first and second storage capacitors Cst1 and Cst2 hold the video signal applied from the data line DL and then charged during one frame interval. Owing this holding time, the storage capacitors Cst1 and Cst2 keep an application of the video signal from the data line DL to the EL cell OLED. Further, such a structure must include the number of data lines DL receiving each picture signal in correspondence with an input of each video signal such as red (R), green (G) and blue (B) signals. In this case, a high gate voltage is applied, via the pre-stage gate line, to the storage capacitor Cst, thereby maximizing a capacitance value (Q=CV).

Thereafter, the first and second storage capacitors Cst1 and Cst2 apply a data voltage charged, via the first NMOS TFT T1, from the data line DL to the gate electrode of the second NMOS TFT T2. The second NMOS TFT T2 allows the supply voltage line VDD to be connected to an anode of the EL cell OLED with the aid of the data voltage charged in the first and second storage capacitors Cst1 and Cst2. As a result, the EL cell OLED is driven by a voltage difference between the supply voltage VDD and the ground voltage GND, thereby generating light corresponding to the voltage difference.

As described above, according to the present invention, a capacitance value of the storage capacitor is maximized with the aid of the pre-stage gate line upon formation of the storage capacitor, so that it becomes possible to prevent flicker caused by a kickback phenomenon. Furthermore, an additional wiring for enhancing a capacitance are not required, so that it becomes possible to improve a process stability as well as an aperture ratio.

It will be apparent to those skilled in the art that various modifications and variations can be made in the method of crystallizing the amorphous silicon without departing from the spirit or scope of the invention. Thus, it is intended that the present invention cover the modifications and variations of this invention provided they come within the scope of the appended claims and their equivalents.

What is claimed is:

1. An electro-luminescence panel comprising:
   a plurality of gate lines;
   a plurality of data lines crossing the gate lines;
   a plurality of electro-luminescence cells arranged at crossings between the gate lines and the data lines; and
   an electro-luminescence cell driving circuit for driving the electro-luminescence cells, said electro-luminescence cell driving circuit including:
      a power supply for supplying power to the electro-luminescence cells;
      a first thin film transistor connected between the power supply and the electro-luminescence cell;
      a second thin film transistor connected between the data line and a gate electrode of the first thin film transistor to serve a switch of the electro-luminescence cell; and
   a first capacitor connected between the gate electrode of the first thin film transistor and a pre-stage gate line.

2. The electro-luminescence panel according to claim 1, further comprising:
   a second capacitor connected between the gate electrode of the first thin film transistor and the power supply.

3. The electro-luminescence panel according to claim 1, wherein the first thin film transistor and the second thin film transistor are any one type of PMOS type or NMOS type.

4. An electro-luminescence panel comprising:
   gate lines and data lines arranged on a glass substrate to cross each other;
   pixel elements arranged at crossings between the gate lines and data lines;
   each of the pixel elements driven when gate signals on the gate lines are enabled, wherein light corresponding to the magnitude of a pixel signal on the data line is generated, wherein each of the pixel elements consists of an electro-luminescence cell and an electro-luminescence cell driving circuit for driving the electro-luminescence cell, wherein the electro-luminescence cell driving circuit is connected between the electro-luminescence cell and a pre-stage gate line;
   a gate driver connected to the gate lines, wherein the gate driver sequentially drives the gate lines; and
   a data driver connected to the data lines, wherein the data driver applies pixel signals, via the data lines, to the pixel elements.

5. The electro-luminescence panel of claim 4, wherein the electro-luminescence cell is connected to a ground voltage source.

6. The electro-luminescence panel of claim 4, wherein the electro-luminescence driving circuit includes a second PMOS TFT connected between the electro-luminescence cell and a supply voltage line to serve a driver, a first PMOS TFT connected between a data line and the gate electrode of the second PMOS TFT to serve as a switch of the electro-luminescence cell, and a storage capacitor connected between the drain electrodes of the first PMOS TFT and the pre-stage gate line.

7. The electro-luminescence panel of claim 4, wherein the electro-luminescence driving circuit includes a second NMOS TFT connected between the electro-luminescence cell and a supply voltage line to serve a driver, a first NMOS TFT connected between a data line and the gate electrode of the second NMOS TFT to serve as a switch of the electro-luminescence cell, and a storage capacitor connected between the drain electrodes of the first NMOS TFT and the pre-stage gate line.

8. The electro-luminescence panel of claim 4, wherein the electro-luminescence driving circuit includes a second PMOS TFT connected between the electro-luminescence cell and a supply voltage line to serve a driver, a first PMOS TFT connected between a data line and the gate electrode of the second PMOS TFT to serve as a switch of the electro-luminescence cell, a first storage capacitor connected between the drain electrodes of the first PMOS TFT and the pre-stage gate line; and a second storage capacitor connected between the drain electrode of the first PMOS TFT and the supply voltage line.

9. The electro-luminescence panel of claim 4, wherein the electro-luminescence driving circuit includes a second NMOS TFT connected between the electro-luminescence cell and a supply voltage line to serve a driver, a first NMOS TFT connected between a data line and the gate electrode of the second NMOS TFT to serve as a switch of the electro-luminescence cell, a first storage capacitor connected between the drain electrodes of the first NMOS TFT and the pre-stage gate line; and a second storage capacitor connected between the drain electrode of the first NMOS TFT and the supply voltage line.

10. A electro-luminescence panel, comprising:
   a plurality of electro-luminescence cells arranged between a plurality of gate and data lines, wherein each of the plurality of electro-luminescence cells is coupled to a driving circuit, the driving circuit comprising:
   a first switch coupled between at least one of the plurality data lines, at least one of the plurality of gate lines, and a second switch, wherein the second switch is coupled between at least one of the plurality of electro-luminescence cells and a supply voltage line; and
   a storage capacitor coupled between an output of the first switch and a gate line preceding the at least one of the plurality of gate lines.

11. The electro-luminescence panel according to claim 10, wherein the first switch comprises a PMOS transistor.

12. The electro-luminescence panel according to claim 10, wherein the second switch comprises a PMOS transistor.

13. The electro-luminescence panel according to claim 10, wherein the first switch comprises an NMOS transistor.

14. The electro-luminescence panel according to claim 10, wherein the second switch comprises an NMOS transistor.

15. The electro-luminescence panel according to claim 10, wherein the first and second switches comprise thin film transistors.

16. The electro-luminescence panel according to claim 10, wherein the first switch is coupled to a gate electrode of the second switch.

17. The electro-luminescence panel according to claim 10, wherein the storage capacitor is coupled to a drain of the first switch.

18. The electro-luminescence panel according to claim 10, further comprising an additional storage capacitor coupled between the first switch and the voltage supply line.

19. The electro-luminescence panel according to claim 18, wherein the additional storage capacitor is coupled to a drain of the first switch.

* * * * *